United States Patent
Doan et al.

(10) Patent No.: US 8,668,837 B2
(45) Date of Patent: Mar. 11, 2014

(54) METHOD FOR ETCHING SUBSTRATE

(75) Inventors: Kenny Linh Doan, San Jose, CA (US); Jong Mun Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 73 days.

(21) Appl. No.: 13/455,354

(22) Filed: Apr. 25, 2012

(65) Prior Publication Data
US 2013/0092656 A1 Apr. 18, 2013

Related U.S. Application Data

(60) Provisional application No. 61/546,735, filed on Oct. 13, 2011.

(51) Int. Cl.
*C03C 15/00* (2006.01)
*H01L 21/302* (2006.01)

(52) U.S. Cl.
USPC ............... 216/67; 216/72; 438/714; 438/715; 438/724; 438/744

(58) Field of Classification Search
USPC ............... 216/67, 72; 438/714, 715, 724, 744
See application file for complete search history.

(56) References Cited

U.S. PATENT DOCUMENTS

| 7,759,239 B1 | 7/2010 | Lin et al. |
|---|---|---|
| 2003/0186545 A1 | 10/2003 | Kamp et al. |
| 2004/0182822 A1 | 9/2004 | Chen et al. |
| 2007/0042603 A1 * | 2/2007 | Kropewnicki et al. ....... 438/689 |

FOREIGN PATENT DOCUMENTS

KR 100895406 B1 5/2009

OTHER PUBLICATIONS

PCT International Search Report and Written Opinion of PCT/US2012/055086 dated Feb. 26, 2013.

* cited by examiner

*Primary Examiner* — Binh X Tran
(74) *Attorney, Agent, or Firm* — Patterson & Sheridan, LLP

(57) ABSTRACT

A method for etching a substrate includes etching at least one first layer of the substrate with a non-uniform substrate temperature and etching at least one second layer of the substrate with uniform substrate temperatures.

9 Claims, 7 Drawing Sheets

| ESC Temp | (25/25)°C | (25/15)°C |
|---|---|---|
| Contour Maps |  |  |
| Means (nm) | 47.2 | 50.3 |
| 3 Sigma (nm) | 7.9 | 4.6 |
| Range (nm) | 9.6 | 7.0 |

METHOD FOR ETCHING SUBSTRATE

CROSS-REFERENCE TO RELATED APPLICATION

This application claims benefit of U.S. Provisional Application Ser. No. 61/546,735 filed Oct. 13, 2011, which is incorporated by reference in its entirety.

BACKGROUND OF THE INVENTION

1. Field of the invention

This invention relates to a method for etching substrate, and more particularly, to the method for etching some layers of the substrate with uniform temperature control to the substrate and some layers of the substrate with non-uniform temperature control to the substrate.

2. Description of the prior art

In the manufacture of the integrated circuits, precise control of various process parameters is necessary for achieving consistent results within a substrate, as well as the results that are reproducible from substrate to substrate. During processing, changes in the temperature and temperature gradients across the substrate may be detrimental to material deposition, etch rate, step coverage, feature taper angles, and other parameters of semiconductor devices. As such, generation of the pre-determined pattern of temperature distribution across the substrate is one of critical requirements for achieving high yield.

The 2003 edition of the International Technology Roadmap for Semiconductors states that reduction in the transistor gate critical dimension (CD) will be a key challenge for etch technology in the future. Therefore, much work has been done to study the influence of gate etch process parameters on the ability to control CD's, since the gate CD contributes significantly to the ultimate performance of a device. Several different strategies for gate CD control have been published, including photoresist trimming and control of the gate hard mask etch chemistry. The former approach reduces the photoresist dimension below what is possible lithographically by lateral etching of the photoresist, while the latter approach relies on etch by-products redeposited on the sidewalls during the hard mask etch to passivate and control the amount of lateral etching relative to vertical etching. Sidewall passivation by etching by-products is not limited only to the hard mask etch step, but also occurs during the gate main etch, soft landing, and over etch steps.

The rate of this redeposition of etch by-products is expected to follow both the gas phase concentration of by-products and the sticking coefficient of those by-products. Sticking coefficients have been used in gas-surface reaction mechanisms to describe the probability of an incident gas phase species adsorbing to a surface, and they are typically approximated as the ratio of the number of species that are reactively adsorbed on a surface to the total number of incident species.

However, the conventional substrate pedestals have insufficient means for controlling substrate temperature distribution across the diameter of the substrate. The inability of control substrate temperature uniformity has an adverse effect on process uniformity both within a single substrate and between substrates, device yield and overall quality of processed substrates.

Therefore, there is a need in the art for an improved method for etching a substrate.

SUMMARY OF THE INVENTION

One object of the present invention is to provide a method for etching a substrate, so as to control the CDs uniformity of the substrate effectively.

According to an embodiment of the invention, the method for etching a substrate, which has a first area and a second area and is formed by stacking at least one first layer and at least one second layer, includes: etching the at least one first layer with setting a first temperature to the first area and setting a second temperature to the second area, wherein the first temperature is different from the second temperature; and, etching the at least one second layer with setting a third temperature to the first area and the second area.

Accordingly, the CDs uniformity of the substrate can be well controlled by independently setting uniform temperatures for etching some layers and non-uniform temperatures for etching other layers of the substrate.

On the advantages and the spirit of the invention, it can be understood further by the following invention descriptions and attached drawings.

BRIEF DESCRIPTION OF THE APPENDED DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
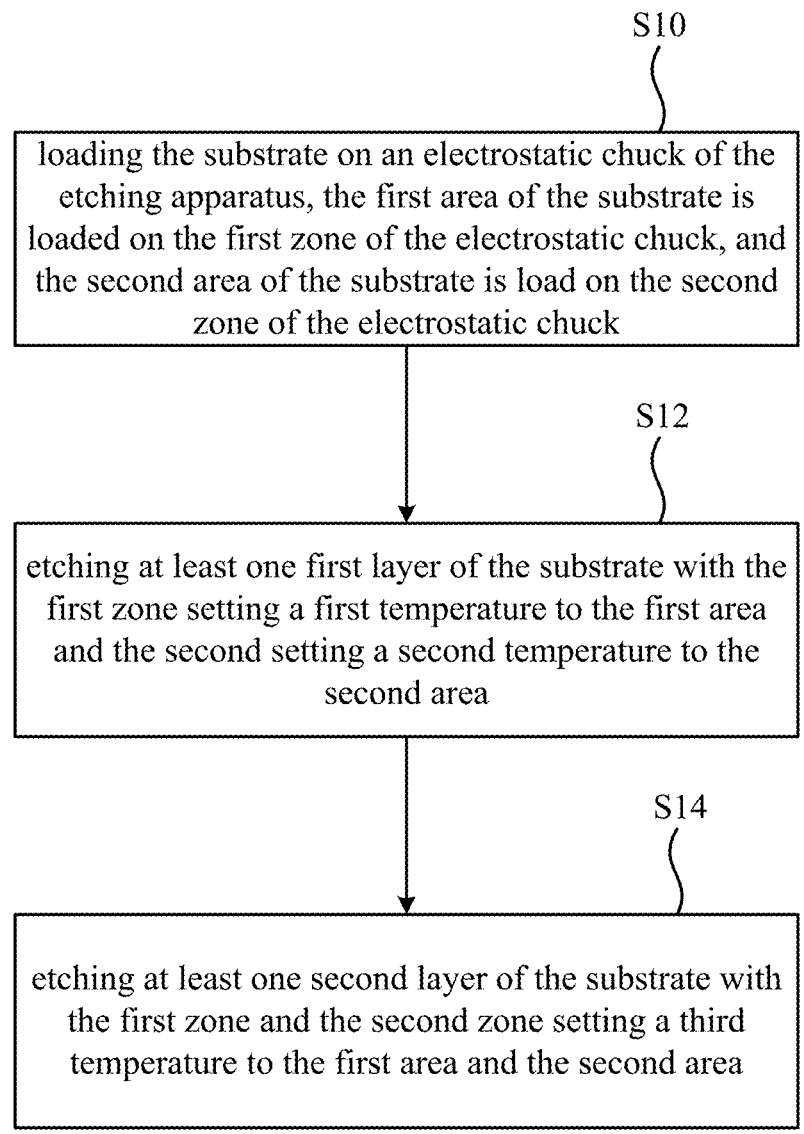
FIG. 1 is a flow chart illustrating a method for etching a substrate according to an embodiment of the invention.

FIG. 3A~3D are schematic drawings illustrating a portion of a substrate with multilayered film stacks etched by the method shown in FIG. 1 according to another embodiment of the invention.

Figure 4:
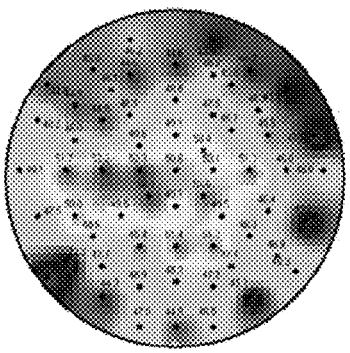
Figure 4:
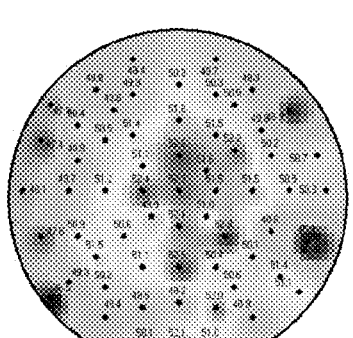

FIG. 4 is a table comparing conventional processing results with those obtained by practice of the embodiments of the invention.

It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 2:
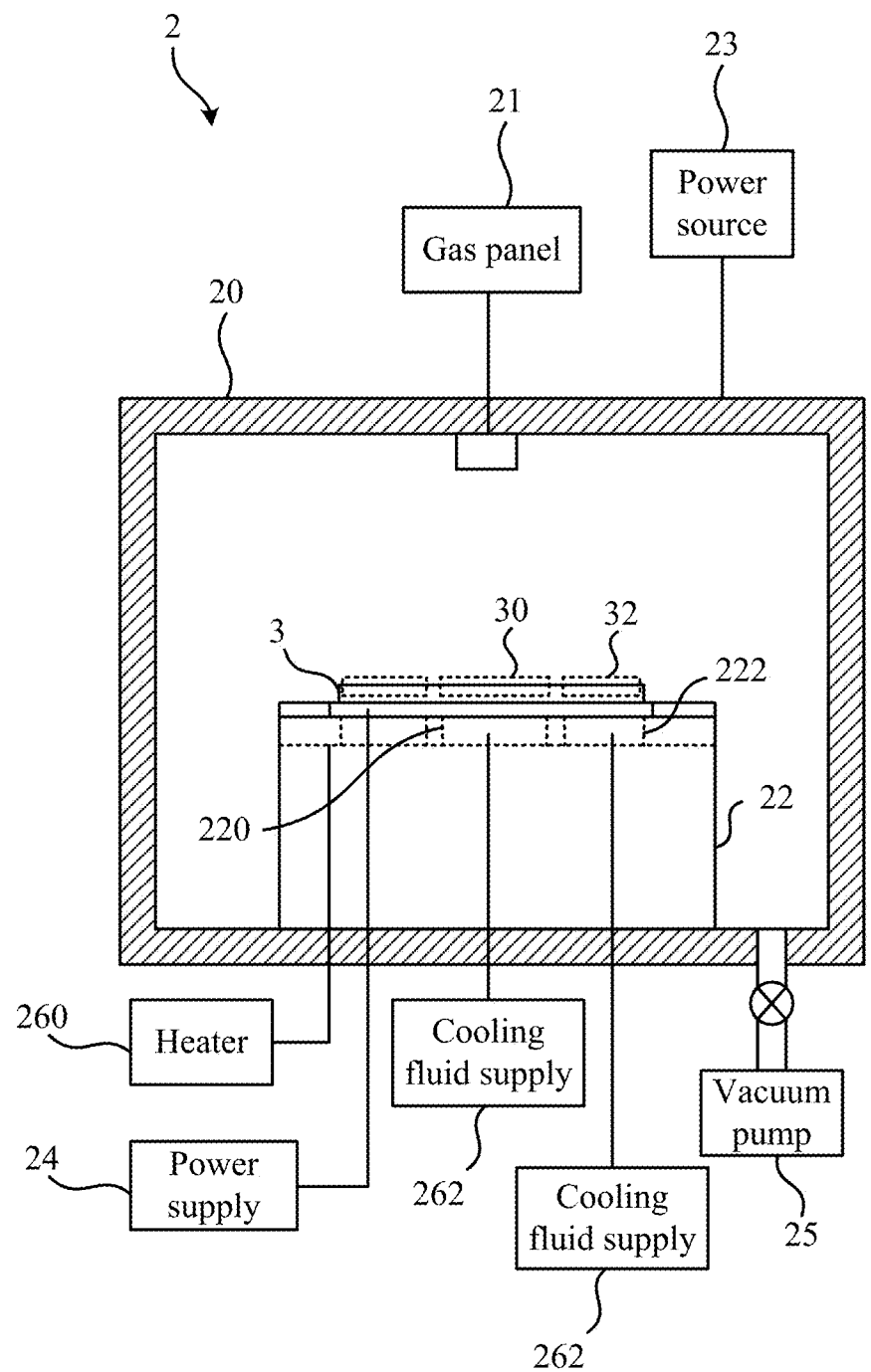
FIG. 2 is a schematic drawing illustrating an etching apparatus for etching a substrate by the method shown in FIG. 1.

FIG. 1 is a flow chart illustrating a method for etching a substrate according to an embodiment of the invention, and FIG. 2 is a schematic drawing illustrating an etching apparatus 2 for etching a substrate 3 by the method shown in FIG. 1. As shown in FIG. 1 and FIG. 2, the method includes the following sequence: at block S10, loading the substrate 3 on an electrostatic chuck 22 of the etching apparatus 2, where the first area 30 of the substrate 3 is positioned on the first zone 220 of the electrostatic chuck 22, and the second area 32 of the substrate 3 is positioned on the second zone 222 of the electrostatic chuck 22; at block S12, etching at least one first layer disposed on the substrate 3 with the first zone 220 setting a first temperature to the first area 30 and the second zone 222 setting a second temperature to the second area 32; and, at block S14, etching at least one second layer of the substrate 3 with the first zone 220 and the second zone 222 setting a third temperature to the first area 30 and the second area 32. The first zone 220 and first area 30 are concentric with the second zone 222 and second area 32, for example, the second zone 222 and second area 32 being a ring surrounding the first zone 220 and first area 30.

In FIG. 2, the etching apparatus 2 includes an etching chamber 20, a gas panel 21, the electrostatic chuck 22 set in the etching chamber 20, a power source 23, a power supply 24, a vacuum pump 25, and a temperature control device having a heater 260 and several cooling fluid supplies 262. For the process of substrate etching, the vacuum pump 25 extracts air from the etching chamber 20 and the gas panel 21 introduces the plasma gas in the etching chamber 20. The power source 23 is capable of providing RF power to ignite and maintain the plasma in the etching chamber 20.

The electrostatic chuck 22 includes a puck 224 to carry the substrate 3. The power supply 24 is capable of being connected to the puck 224 to bias the electrostatic chuck 22 and maintain the plasma in etching chamber 20. The heater 260 is coupled to the puck 224 and the cooling fluid supplies 262 are respectively coupled to the first zone 220 and the second zone 222 of the electrostatic chuck 22 in a manner that allows the temperature of each zone 220, 222 to be set and controlled independently. The heater 260 is capable of raising the temperature and the cooling fluid supplies 262 are capable of lowering the temperature of the puck 224 by applying cooling fluid such as a gas and/or liquid. By the heater 260 and the cooling fluid supplies 262, the temperature on the puck 224 and the substrate 3 can be controlled. It should be noted that the cooling fluid supplies 262 are coupled to the first zone 220 and the second zone 222 respectively, so that the temperatures of the first area 30 and the second area 32 of the substrate 3 can be set independently to each other so that the center and perimeter regions of the substrate 3 may be set at either the same or different temperatures. In practice, the heater and the cooling fluid supplies can be connected to a control system for adjusting the temperatures on the puck. Furthermore, in another embodiment, only one cooling fluid supply may be adopted and the control system may enable the cooling fluid supply to provide different flows of the cooling fluid to different zones for independent temperature control.

Referring back to FIG. 1, at block S12 of the method, the at least one first layer of substrate 3 is etched with the condition of setting the first temperature to the first area 30 and setting the second temperature to the second area 32. The plasma within the etching chamber 20, as shown in FIG. 2, generally has fewer passivating species at the edge portion or peripheral portion of the substrate 3 (the second area 32 in FIG. 2) normally resulting in increased lateral etching near the edge compared to the central portion of the substrate 3 (the first area 30 in FIG. 2). To achieve improved CD uniformity, the second temperature set to the second area 32 may be lower than the first temperature set to the first area 30 to increase the amount of passivating species deposited at the edge of the substrate, thereby compensating for the decreased amount of passivating species available to interact with the substrate at the substrate's edge.

At block S14 of the method, the at least one second layer of substrate 3 is etched with the condition of setting the third temperature to the first area 30 and the second area 32. It should be noted that the at least one second layer is stacked below the at least one first layer, and the chemistry for etching the second layer is more anisotropic than the chemistry for etching the first layer. In this condition, the non-uniform temperature profile on the substrate may result in non-uniform CD due to the substrate temperature gradient encouraging passivation at the edge of the substrate. In other words, keeping a non-uniform temperature profile for etching all layers of a film stack may result in uniform CDs for the at least one first layer but the non-uniform CD for the at least one second layer, thereby losing CD control in features etched through multiple layers of the film stack.

In practice, the substrate can be divided into not only two areas but a plurality of areas, and the electrostatic chuck can be correspondingly divided into a plurality of areas, each having independent temperature control. The temperature profile on the substrate can be adjusted more precisely using independent temperature control so that CD control can be maintained when etching a feature through multiple layers.

Figure 3A:
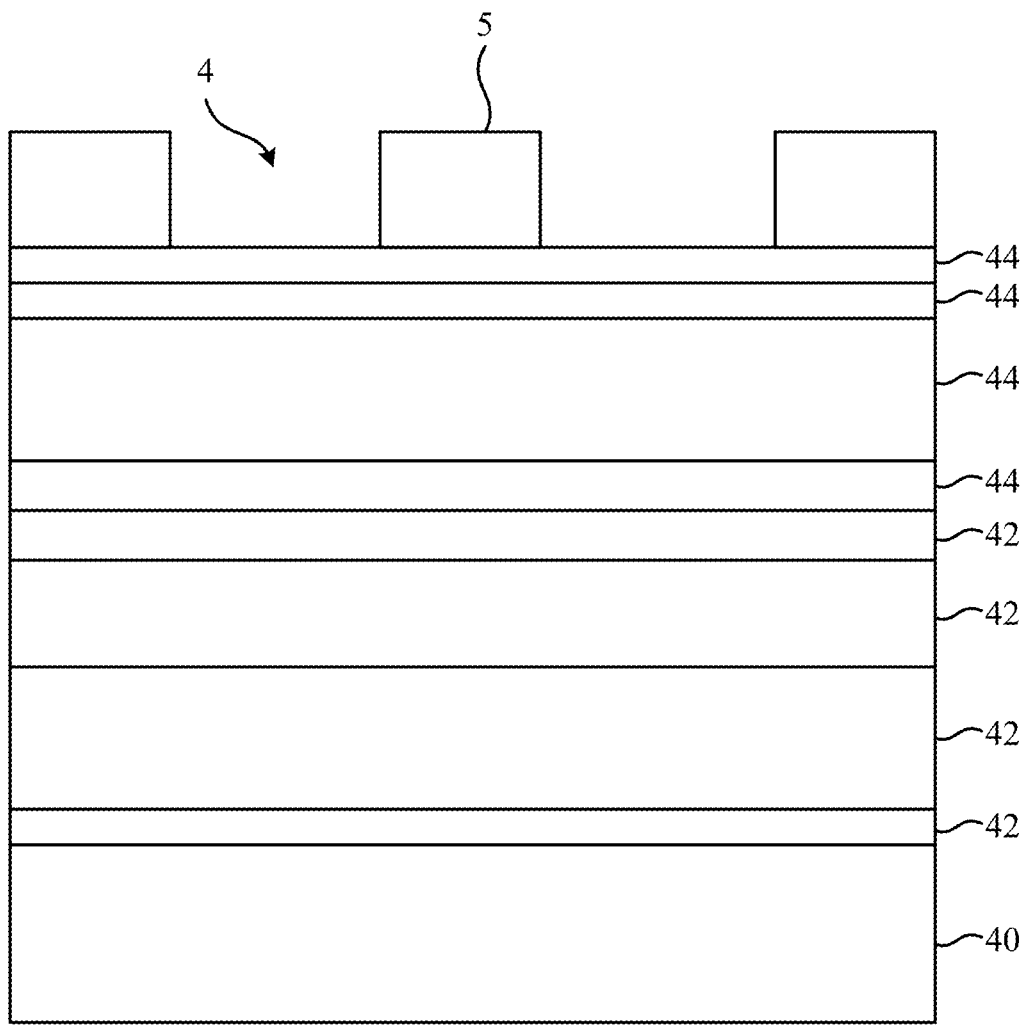

FIG. 3A-3D are schematic drawings illustrating a portion of a substrate 4 with multilayered film stacks etched by the method shown in FIG. 1 according to another embodiment of the invention. As shown in FIG. 3A, the substrate 4 includes a base 40, four second layers 42 deposited on the base 40, and four first layers 44 deposited on the top layer of the second layers 42. Photoresist 5 is formed on the top layer of the first layers 44. The first layers 44 from the top to bottom are BARC layer, SiON layer, ACL, and TEOS (tetraethylorthosilicate) layer. The second layers 42 from the top to bottom are Silicon Nitride layer, TEOS layer, PSG (phosphosilicate glass) layer, and Silicon Nitride layer. The substrate 4 is divided into the first area near the central portion and the second area near the edge portion, and FIG. 3A-3D could be the film stack views in the first area or the second area. To etch the four first layers 44, the temperature to the first area can be set to about 25° C., and temperature to the second area can be set to about 15° C., as illustrating in block S12 in FIG. 1.

The BARC layer may be etched using an oxygen-free mixture of $CHF_3$, $CF_4$ and $N_2$. The ratio of $CHF_3$ to $CF_4$ is greater than 3:1, while the ratio of $N_2$ to $CF_4$ is also greater than 3:1, with more $CHF_3$ provided relative to $N_2$. The chamber pressure during etching is maintained over 100 mTorr, such as at about 150 mTorr.

The SiON layer may be etched using a mixture of $O_2$ and $N_2$. The ratio of $O_2$ to $N_2$ is greater than about 4:1. The chamber pressure during etching is maintained less than 50 mTorr, such as at about 2 mTorr.

The ACL layer may be etched using the same process used to etch the SiON layer.

The TEOS layer may be etched using a mixture of $O_2$ and $N_2$. The ratio of $O_2$ to $N_2$ is greater than about 4:1. The chamber pressure during etching is maintained less than 50 mTorr, such as at about 2 mTorr.

The Silicon Nitride layer and the TEOS layer of the second layers 42 may be etched using a nitrogen-free mixture of $C_4F_8$, $CH_2F_2$, $CHF_3$ and $O_2$. The amount of $C_4F_8$ and $CH_2F_2$, used to etch the TEOS layer is greater than the amount used to etch the Silicon Nitride layer. Ar may also be included in the gas mixture at a ratio of at least 3 times the amount of $C_4F_8$. The chamber pressure during etching is maintained at the same pressure used to etch the SiON layer, ACL layer and TEOS layer of the first layers 44.

The Silicon Nitride layer and the TEOS layer of the second layers 42 may be etched using a nitrogen-free mixture of $C_4F_8$, $CH_2F_2$, $CHF_3$ and $O_2$. The amount of $C_4F_8$ and $CH_2F_2$, used to etch the TEOS layer is greater than the amount used to etch the Silicon Nitride layer. Ar may also be included in the gas mixture at an ratio of at least 3 times the amount of $C_4F_8$. The chamber pressure during etching is maintained at the same pressure used to etch the SiON layer, ACL layer and TEOS layer of the first layers 44.

Figure 3B:
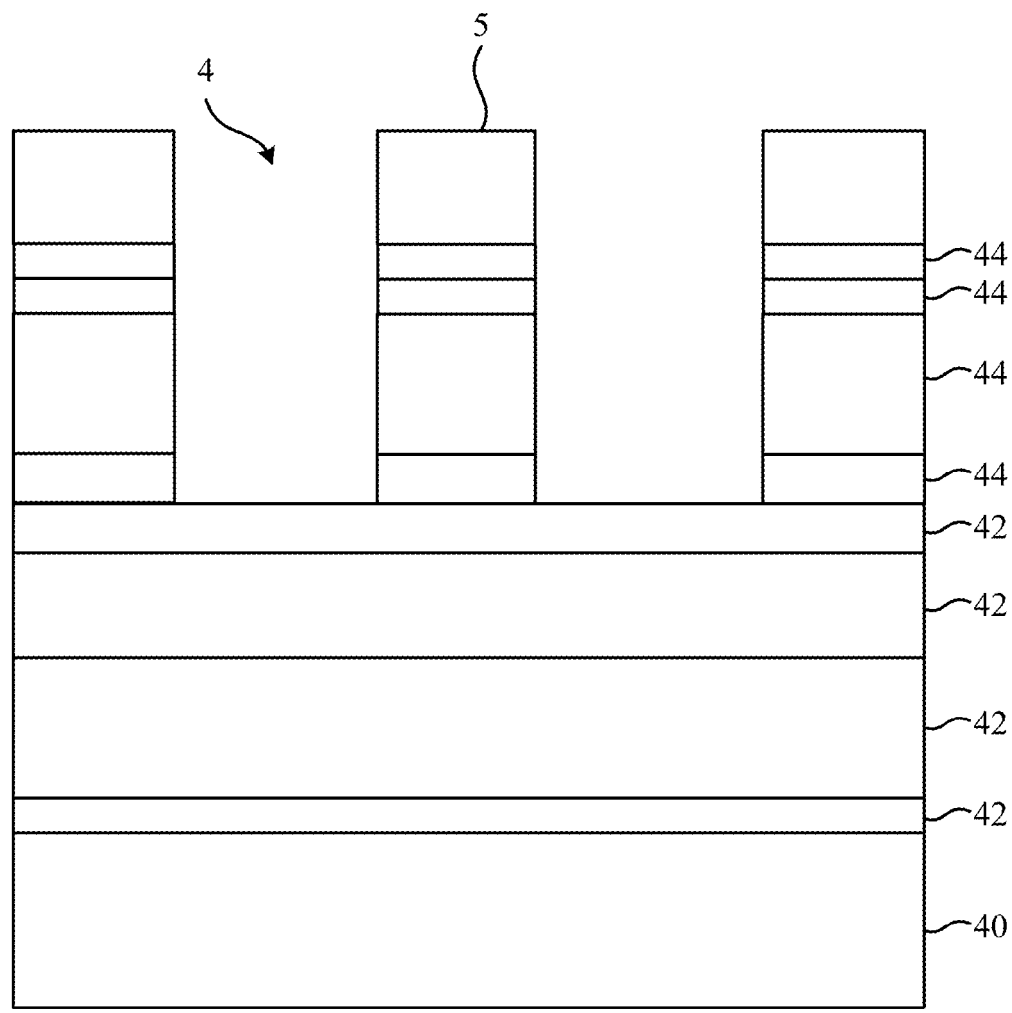
Figure 3C:
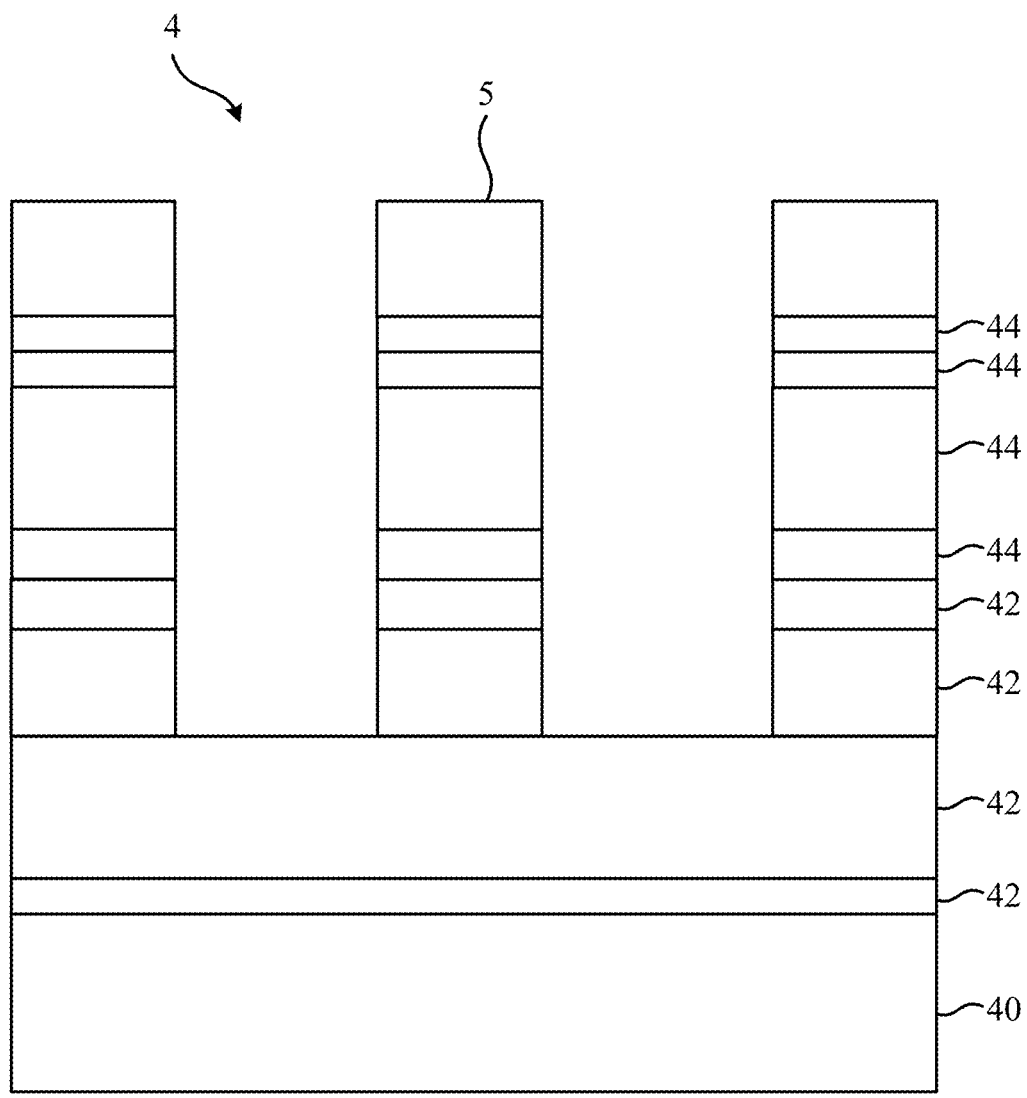
Figure 3D:
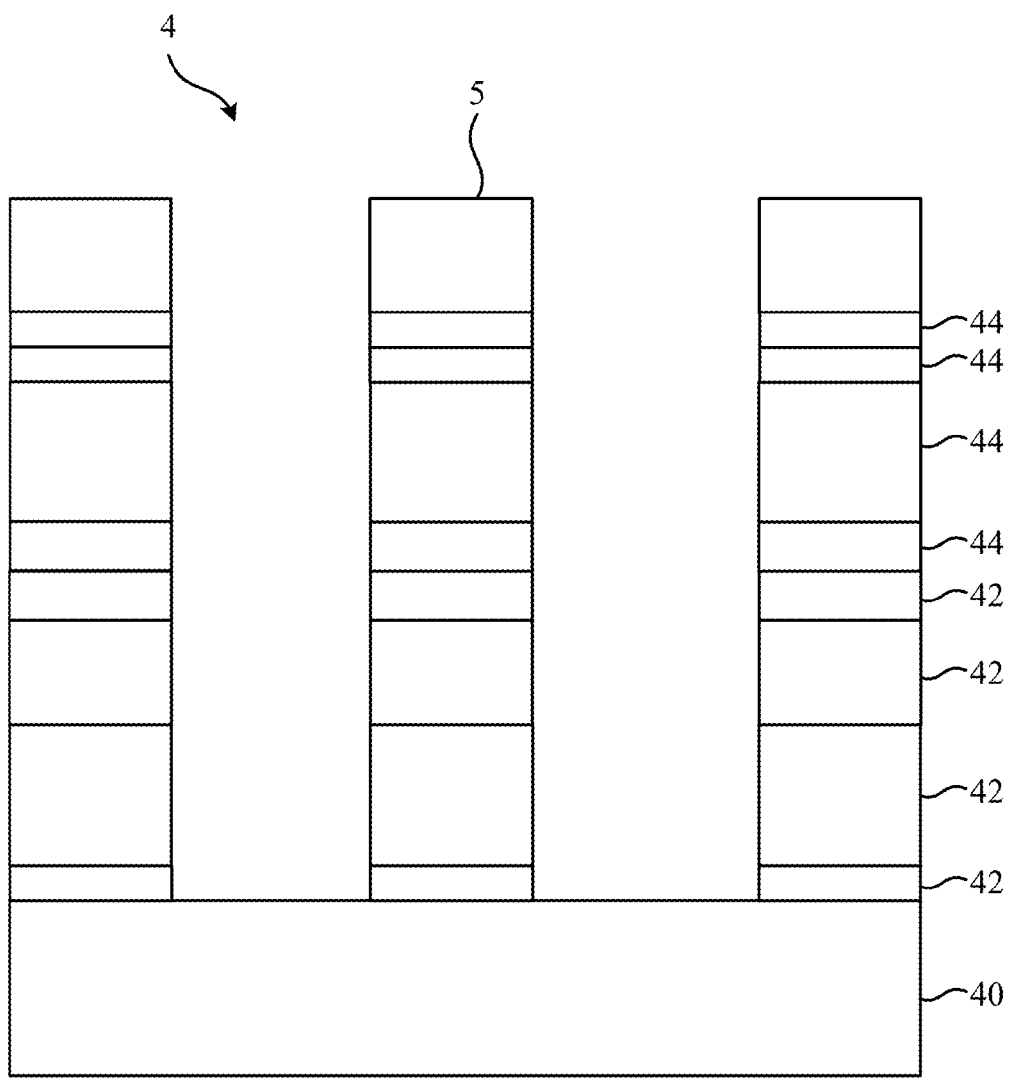

As shown in FIG. 3C, after etching the upper two layers of the second layers 42, the lower two layers of the second layers 42 (the PSG layer and the Silicon Nitride layer) are etched with the temperature to the first area and the second area set to about 50° C., as illustrated in block S14 in FIG. 1. FIG. 3D illustrates that the etching process which changes between uniform and non-uniform temperature gradients, allows the film stacks to be etched while enhancing CD uniformity.

The PSG layer and Silicon Nitride layer may be etched using a mixture of $C_4F_6$, $C_4F_8$, $CF_4$, CO, $N_2$ and $O_2$. The amount of $C_4F_8$ and $CH_2F_2$, used to etch the TEOS layer is greater than the amount used to etch the Silicon Nitride layer. The chamber pressure during etching is maintained at the same pressure used to etch the SiON layer, ACL layer and TEOS layer of the first layers 44. Ar may also be included in the gas mixture at a ratio of at least 10 times the amount of $C_4F_8$.

As described above, the edge portion or peripheral portion of the substrate 4 etches more laterally on the upper layers. Thus, the temperature of the second area is set to about 15° C., which is lower than the temperature set to the first area of about 25° C. when etching the four first layers 44. Uniform temperatures, about 35° C. and about 50° C., are set across the whole substrate 4 while etching the four second layers 42. The sidewall passivation forms more readily on the deep layers when the temperature is elevated, and thus, the temperatures of the substrate 4 when etching the second layers 42 should be higher than that used for etching the first layers 44 to assist controlling CD uniformity of the substrate 4 more effectively.

FIG. 4 is a comparison of uniformity results obtained utilizing uniform temperatures and utilizing a temperature gradient for etching the first layers 44. The contour maps CD uniformity taken at various points across the substrate. The contour maps illustrate significant improvement in CD uniformity over etching at uniform substrate temperatures.

Compared to the prior art, the method for etching a substrate of the present invention includes etching some layers with uniform substrate temperature while etching other layers with non-uniform substrate temperature. Accordingly, by adjusting the substrate temperature uniformity while etching different layers, the CD uniformity can be controlled more effectively.

While the foregoing is directed to embodiments of the present invention, other and further embodiments of the invention may be devised without departing from the basic scope thereof, and the scope thereof is determined by the claims that follow.

What is claimed is:

1. A method for etching a substrate, the substrate being formed by stacking at least one first layer over at least one second layer, the substrate having a first area inward of a second area thereon, the method comprising:
    etching the at least one first layer with the first area set to a first temperature and the second area set to a second temperature, wherein the first temperature is greater than the second temperature, wherein the one or more first layers comprises:
    a BARC layer;
    a SiON layer disposed below the BARC layer;
    an ACL (amorphous carbon) layer disposed below the SiON layer; and
    a TEOS (tetraethylorthosilicate) layer disposed below the ACL layer; and
    etching the at least one second layer with the first area and the second area set to a third temperature, wherein the one or more second layers comprises:
    a first silicon nitride layer;
    a TEOS layer disposed below the silicon nitride layer;
    a PSG (phosphosilicate glass) layer disposed below the TEOS layer; and
    a second silicon nitride layer disposed below the PSG (phosphosilicate glass) layer.

2. The method of claim 1, wherein etching the first layer comprises:
    etching the BARC layer using an oxygen-free gas mixture.

3. The method of claim 1, wherein etching the second layer further comprises:
    etching the first silicon nitride layer and the TEOS layer while maintaining the first area and the second area at the same temperature.

4. The method of claim 1, wherein etching the second layer further comprises:
    etching the first silicon nitride layer and the TEOS layer using a nitrogen-free gas mixture.

5. The method of claim 1, wherein etching the first layer further comprises:
    etching the SiON layer using a mixture of $O_2$ and $N_2$; and
    maintaining a chamber pressure less than a chamber pressure utilized to etch the BARC layer.

6. The method of claim 5, wherein etching the first layer further comprises:
    etching the ACL layer using the same process used to etch the SiON layer.

7. The method of claim 1, wherein etching the second layer further comprises:
    etching the first silicon nitride layer and the TEOS layer while maintaining the first area and the second area at a temperature higher than used to etch the first layer.

8. The method of claim 7, wherein etching the second layer further comprises:
    etching the second silicon nitride layer and the PSG layer while maintaining the first area and the second area at a temperature higher than used to etch the first layer.

9. The method of claim 7, wherein etching the second layer further comprises:
    etching the second silicon nitride layer and the PSG layer while maintaining the first area and the second area at a temperature higher than used to etch the first silicon nitride layer and the TEOS layer.

* * * * *

UNITED STATES PATENT AND TRADEMARK OFFICE
CERTIFICATE OF CORRECTION

| | | |
|---|---|---|
| PATENT NO. | : 8,668,837 B2 | Page 1 of 1 |
| APPLICATION NO. | : 13/455354 | |
| DATED | : March 11, 2014 | |
| INVENTOR(S) | : Doan et al. | |

It is certified that error appears in the above-identified patent and that said Letters Patent is hereby corrected as shown below:

In the Specification

In Detailed Description:
Column 4, Line 25, delete "BARO" and insert --BARC-- therefor;

Column 4, Lines 52-60, delete
"The Silicon Nitride layer and the TEOS layer of the second layers 42 may be etched using a nitrogen-free mixture of $C_4F_8$, $CH_2F_2$, $CHF_3$ and $O_2$. The amount of $C_4F_8$ and $CH_2F_2$, used to etch the TEOS layer is greater than the amount used to etch the Silicon Nitride layer. Ar may also be included in the gas mixture at a ratio of at least 3 times the amount of $C_4F_8$. The chamber pressure during etching is maintained at the same pressure used to etch the SiON layer , ACL layer and TEOS layer of the first layers 44."
and insert
--As shown in FIG. 3B, after etching the first layers 44, the upper two layers of the second layers 42 (the Silicon Nitride layer and the TEOS layer) are going to be etched with the temperature to the first area and the second area both set to about 35°C.-- therefor;

Column 4, Line 66, delete "an" and insert --a-- therefor.

Signed and Sealed this
Twenty-fourth Day of June, 2014

Michelle K. Lee
*Deputy Director of the United States Patent and Trademark Office*